United States Patent
Bang et al.

(10) Patent No.: US 7,911,128 B2
(45) Date of Patent: Mar. 22, 2011

(54) ORGANIC ELECTROLUMINESCENCE DISPLAY DEVICE HAVING ANODE AND DRAIN SEALING STRUCTURE AND A METHOD FOR FABRICATING THEREOF

(75) Inventors: Hee-Suk Bang, Gyeonggi-Do (KR); Chang-Wook Han, Seoul (KR); Tae-Joon Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 323 days.

(21) Appl. No.: 11/207,228

(22) Filed: Aug. 18, 2005

(65) Prior Publication Data

US 2006/0138942 A1 Jun. 29, 2006

(30) Foreign Application Priority Data

Dec. 29, 2004 (KR) .................. 10-2004-0115560

(51) Int. Cl.
*H05B 33/00* (2006.01)
*H01J 1/62* (2006.01)
*H05B 33/10* (2006.01)

(52) U.S. Cl. ......... 313/504; 313/507; 313/512; 313/506; 445/24; 315/169.4

(58) Field of Classification Search ........... 313/501–512
See application file for complete search history.

(56) References Cited

U.S. PATENT DOCUMENTS

| | | | | |
|---|---|---|---|---|
| 5,834,893 A * | 11/1998 | Bulovic et al. | ............... | 313/506 |
| 6,255,774 B1 * | 7/2001 | Pichler | ............... | 313/504 |
| 6,366,017 B1 * | 4/2002 | Antoniadis et al. | ............... | 313/506 |
| 6,630,784 B2 * | 10/2003 | Yoneda | ............... | 313/504 |
| 6,650,045 B1 * | 11/2003 | Forrest et al. | ............... | 313/504 |
| 2004/0021434 A1 * | 2/2004 | Yoneda | ............... | 315/504 |
| 2004/0195965 A1 * | 10/2004 | Yamazaki et al. | ............... | 313/506 |
| 2004/0207322 A1 * | 10/2004 | Okuyama et al. | ............... | 313/512 |
| 2005/0116620 A1 * | 6/2005 | Kobayashi | ............... | 313/503 |
| 2005/0140287 A1 * | 6/2005 | Ko | ............... | 313/506 |
| 2005/0174039 A1 * | 8/2005 | Nishikawa et al. | ............... | 313/495 |
| 2005/0249974 A1 * | 11/2005 | Mori et al. | ............... | 428/690 |
| 2006/0269782 A1 * | 11/2006 | Liao et al. | ............... | 428/690 |

FOREIGN PATENT DOCUMENTS

| | | |
|---|---|---|
| KR | 10-2004-0000630 | 1/2004 |
| KR | 10-2004-0015507 | 2/2004 |

OTHER PUBLICATIONS

Office Action dated Jul. 13, 2006 for corresponding Korean Patent Application No. 10-2004-0115560.

* cited by examiner

*Primary Examiner* — Peter J MacChiarolo
*Assistant Examiner* — Tracie Green
(74) *Attorney, Agent, or Firm* — Brinks Hofer Gilson & Lione

(57) ABSTRACT

An organic electroluminescence display device and a fabrication method thereof is described. The organic electroluminescence display device includes first and second substrates. A cathode including a transparent conductive material and a thin metal film, an organic electroluminescence (EL) layer formed on the cathode, and an anode formed on the organic EL layer are formed on the first substrate. A driving transistor that contains a drain electrode is formed on the second substrate. The first and second substrates are bonded to each other such that the drain electrode contacts the anode.

21 Claims, 7 Drawing Sheets

ORGANIC ELECTROLUMINESCENCE DISPLAY DEVICE HAVING ANODE AND DRAIN SEALING STRUCTURE AND A METHOD FOR FABRICATING THEREOF

PRIORITY CLAIM

This application claims the benefit of the Korean Patent Application No. P2004-115560, filed on Dec. 29, 2004, which is hereby incorporated by reference as if fully set forth herein.

FIELD OF THE INVENTION

The present invention relates to a structure of an organic electroluminescence display device (OELD) and a method for fabricating thereof, and particularly, to an OELD in which an organic electroluminescence (EL) layer is formed on cover glass and a method for fabricating thereof.

DESCRIPTION OF THE RELATED ART

The twenty first century is expected to be an information oriented society. Accordingly, the development of a high-performance flat panel display device for multimedia has become important because information needs to be easily acquired anywhere. In particular, in terms of communications and computers, technical developments of semiconductor and display devices becomes important. OELDs have been drawing increasing attention as a natural color display device.

An EL display device can be divided into a passive matrix organic light emitting device (PMOLED) and an active matrix organic light emitting device (AMOLED) according to its structure. The development of the AMOLED is desirable with the increasing area and resolution of display devices.

An Electroluminescence Display Device (ELD) is a spontaneous luminescent device that emits light by electrical excitation of a fluorescent organic compound. The ELD can be driven at a low driving voltage, thus a thin ELD can be fabricated. In addition, since problems in a liquid crystal display device (LCD) such as viewing angle and response speed can be solved, the ELD has attracted attention as the next generation of display device.

The operational principle of the ELD will be described. Electrons supplied from a power source move to a light-emitting layer through a cathode with the help of an electron transfer layer, while in an anode, holes move to the light-emitting layer with the help of a hole transfer layer. The electron and the hole are combined with each other in the light-emitting layer, an organic material, to thereby form an exciton. The exciton as formed is in an excited state. When the exciton falls into a low energy state, light is emitted. The color of the light emitted varies depending on the organic material. By using an organic material emitting red, green and blue light, a wide spectrum of color may be implemented.

A structure of the organic EL device will be described. The organic EL device can be divided into a single-layer and a multi-layer structure. In the single-layer structure, a single organic light-emitting layer is formed between a cathode and an anode. In the multi-layer structure, a plurality of organic layers including a light-emitting layer are formed between the cathode and the anode. A multi-layer organic EL device is widely used because carriers are not directly injected into the light-emitting layer, which reduces a driving voltage of the structure. A multi-layer organic EL device having a multi-layer will be described with reference to FIG. 1.

As shown in FIG. 1, the organic EL device includes two electrodes and an organic EL layer therebetween. The two electrodes are an anode 102 and a cathode 101, and an organic EL layer 110 is formed between the two electrodes.

The anode 102 is typically formed of a transparent electrode such as ITO (Indium Tin Oxide). The cathode 101 is formed of a metallic thin film such as aluminum, and reflects light generated from a light-emitting layer such that the light can be collected in one direction. Holes are supplied to a light-emitting layer 104 through the anode 102, and electrons are supplied to the light-emitting layer 104 through the cathode 101.

The organic EL layer 110 includes the light-emitting layer 104, an electron transfer layer 103 formed between the light-emitting layer 104 and the cathode 101 and a hole transfer layer 105 formed between the light-emitting layer 104 and the anode 102. The organic EL layer 110 is formed on a substrate 107 such as transparent glass. Unit pixels arranged in a matrix form are formed on the substrate, and an organic EL device having the above-described structure is formed at each unit pixel.

In the multi-layer organic EL device, the organic EL layer has more than one organic layer and a driving voltage can be reduced by further including an electron injection layer and a hole injection layer. FIG. 2 illustrates a structure of a multi-layer organic EL device having an electron injection layer and a hole injection layer, in which light is emitted to the front.

The OELD includes an array substrate in which a plurality of unit pixels are arranged in a matrix form and an organic EL layer formed at each unit pixel on the array substrate. An organic EL device of FIG. 2 uses a front light emitting method by which light being emitted comes out in the direction of the cathode.

With reference to FIG. 2 that illustrates a unit pixel, a thick anode 202 formed of an opaque metal having excellent reflection efficiency of light, such as aluminum, is formed on an array substrate 201 formed of transparent glass or the like. A hole injection layer 203 and a hole transfer layer 204 which are organic layers are sequentially formed on the anode 202. An organic light-emitting layer 205 is formed on the hole transfer layer 204, and an electron transfer layer 206 and an electron injection layer 207 are sequentially formed on the organic light-emitting layer 205. In addition, a transparent cathode 208 formed of a thin layer of aluminum of tens of angstroms (Å) is formed on the electron injection layer 207, and a transparent conductive material 209 such as ITO is formed on the cathode 208. The cathode 208 and the transparent conductive material are combined to form the cathode. The organic EL device is formed inside each of the 'M×N' number of unit pixels on the entire substrate. A seal line 210 is formed at the edge of the array substrate on which the unit pixels are formed and helps attach the cover glass 211 and the array substrate to each other.

In the conventional front light emitting type organic EL device having the aforementioned structure, the thin film 208 such as aluminum which acts as a cathode inside the unit pixel and the transparent conductive material 209 are formed to be thin to transmit light being emitted, and an air gap is generated when the array substrate and the cover glass are attached to each other. This leaves the structure of the conventional organic EL display device vulnerable to moisture. That is, moisture or the like permeates into the space between the array substrate and the cover glass to thereby oxidize the organic EL display device. This problem is exacerbated by the extreme thinness of layer forming the cathode for front light emission, leading to quicker deterioration of the cathode. Thus, the air gap 220 between the array substrate and the cover glass reduces the life span of the organic EL display device by permeation of moisture or the like.

In addition, the air gap formed between the cathode and the cover glass lengthens the path of light generated from the organic light-emitting layer and diffusion or the like is generated while the light passes through the air gap. This reduces the efficiency of the organic EL device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
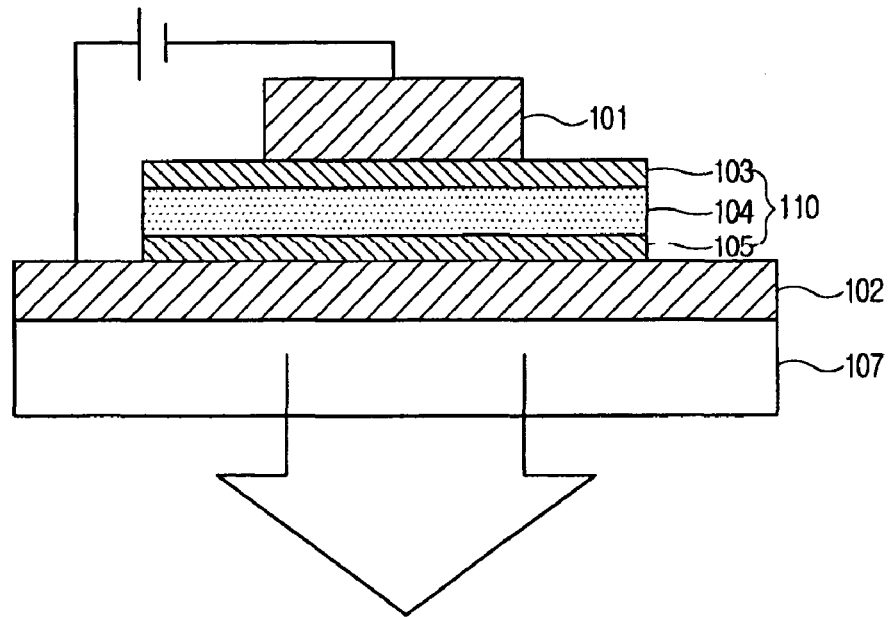
FIG. 1 is a cross-sectional view illustrating a structure of a general organic EL device.
Figure 2:
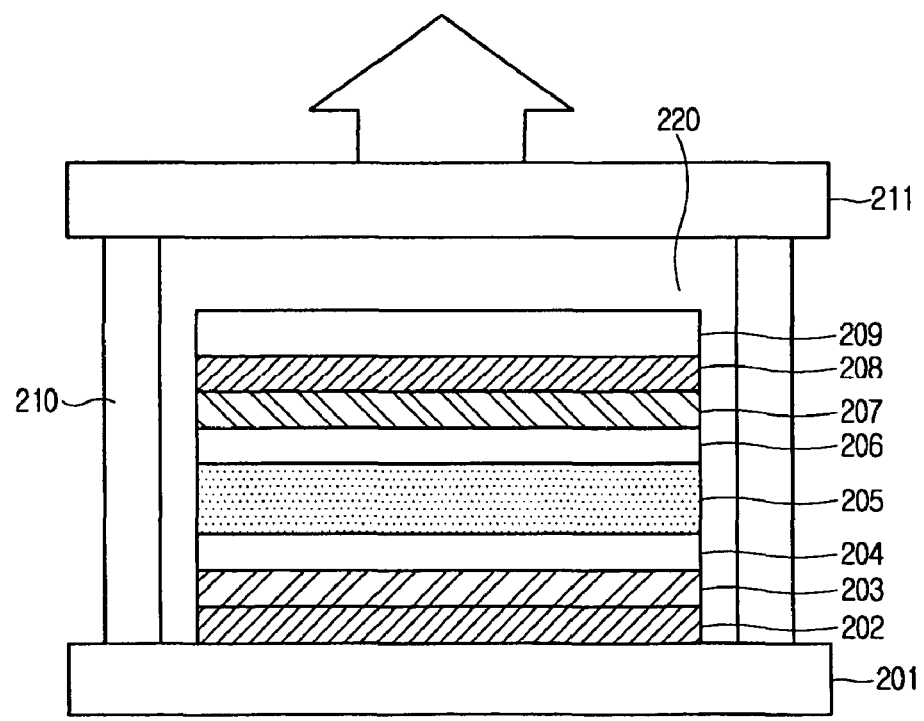
FIG. 2 is a cross-sectional view illustrating a structure of a front light emitting type organic EL device in accordance with a conventional art.
Figure 3:
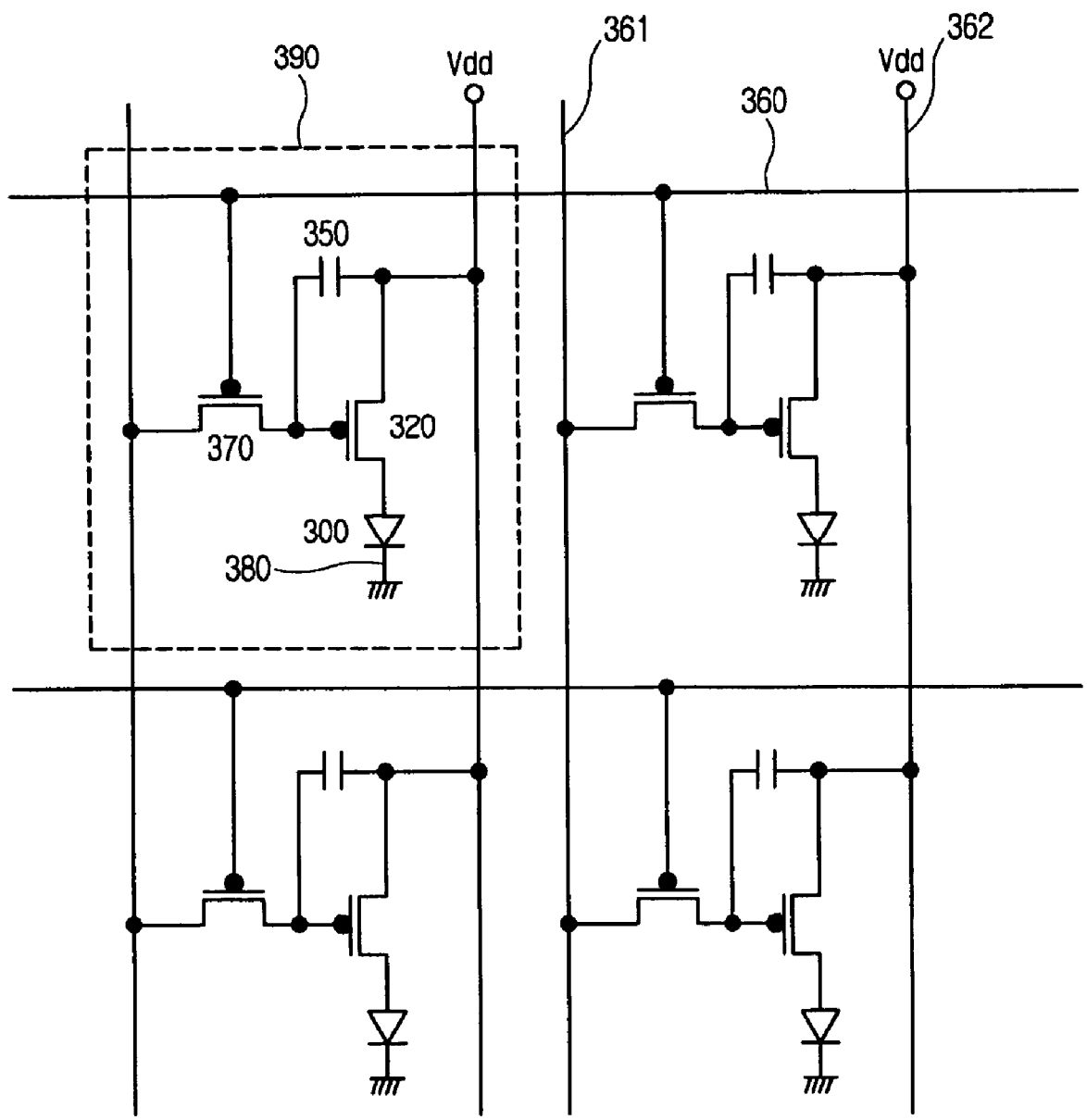
FIG. 3 is a circuit diagram illustrating a unit pixel of the present invention.

With reference to FIG. 3, a basic circuit diagram of an organic EL display device of the present invention will be described. A number ('M×N') of unit pixels 390 are defined on an array substrate (not shown). The unit pixels 390 are arranged in a matrix format.

Each of the unit pixels 390 includes a switching thin film transistor 370, a driving thin film transistor 320, a capacitor 350 and an organic electroluminescence device 300 formed on cover glass (not illustrated). As illustrated in FIG. 3, in the switching thin film transistor 370, a scanning signal is inputted to a gate through a gate line 360 and a data signal is inputted to a source through a data line 361. In addition, a gate electrode of the driving transistor 320 is connected to a drain electrode of the switching thin film transistor 370.

In addition, in the driving transistor 320, a source electrode is connected to a first power supply terminal (Vdd) of a first power line 362 and to the gate of the driving transistor 320 through the capacitor 350, and a drain electrode is connected to an anode of an OEL device 300 of the cover glass. A cathode of the OEL device 300 is connected to a second power supply terminal formed on the cover glass.

The OEL device 300 includes at least one organic layer including an organic light-emitting layer. In particular, a polysilicon thin film transistor having higher electricity mobility than an amorphous silicon thin film transistor is used as the switching thin film transistor and the driving thin film transistor.

Hereinafter, with reference to FIGS. 4A to 4C, an OEL device 300 in accordance with various embodiments of the present invention will be described.

Figure 4A:
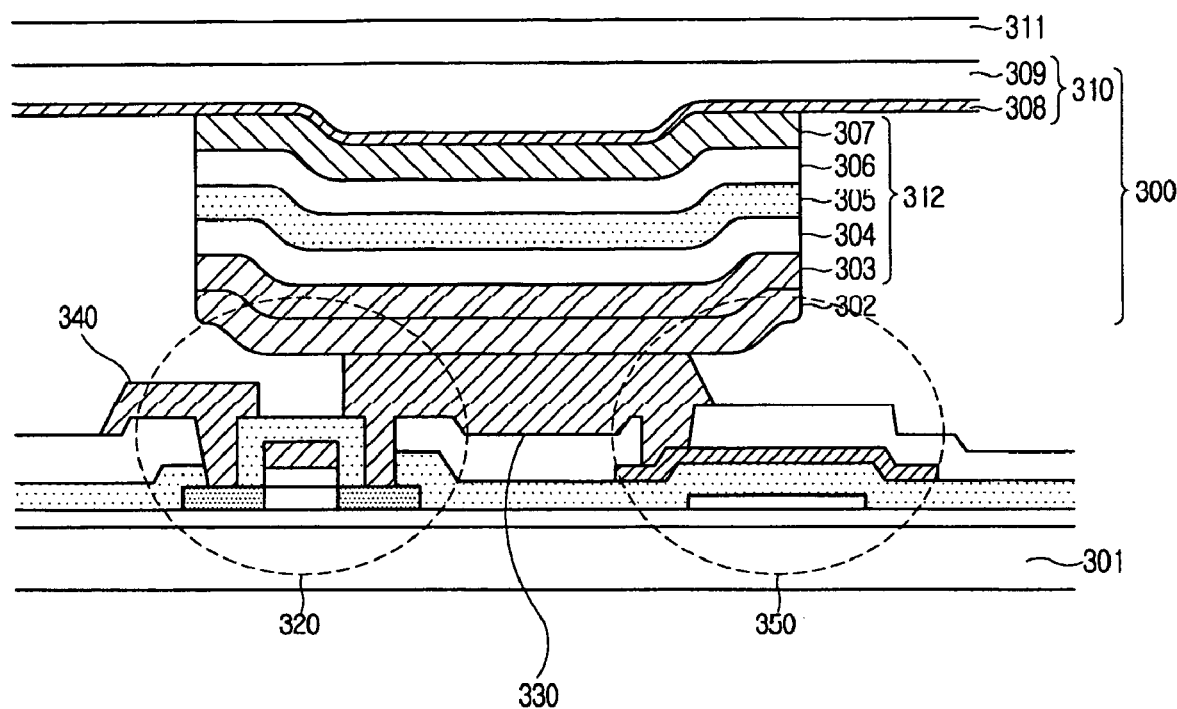
FIGS. 4A to 4C are cross-sectional views illustrating a structure of an organic electroluminescence device of the present invention.
Figure 4B:
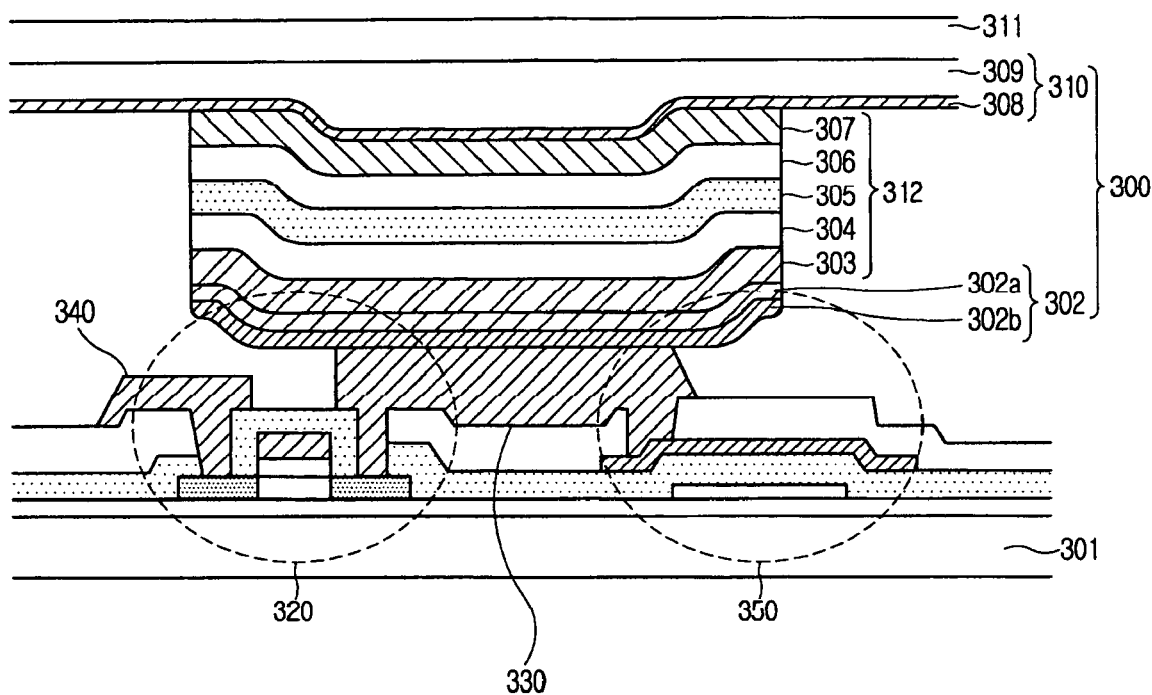

With reference to FIG. 4A, an OELD 300 includes a first substrate 311 formed of glass or another transparent material on which an organic layer structure 312 is formed. A transparent conductive material 309 is formed on the first substrate 311. A thin conductive metal film 308 is formed on the transparent conductive material 308. The transparent conductive material 309 and the thin conductive metal film 308 together form a cathode 310. An electron injection layer 307 and an electron transfer layer 306 are formed on the cathode 310. The electron injection layer 307 and electron transfer layer 306 transmit electrons supplied from the cathode 310 to a light-emitting layer 305. The light-emitting layer 305 is formed on the electron transfer layer 306. A hole transfer layer 304 and a hole injection layer 303 are formed on the light-emitting layer 305. The hole transfer layer 304 and hole injection layer 303 transmit holes from an anode 302 formed thereon to the light-emitting layer 305. Although not shown, a protective layer may be formed on the anode 302 to protect the anode from oxidation, for example.

In addition, a driving thin film transistor 320 having a drain electrode 330 and a capacitor 350 electrically contacting the anode 302 are formed at each unit pixel on an array substrate 301 facing the first substrate 311. The driving thin film transistor 320 also has a source electrode 340 that does not contact the anode 302 of the organic EL device 300. The array substrate 301 and the first substrate 311 are bonded to each other to construct an organic EL device 300 as the drain electrode 330 of the driving thin film transistor 320 and the anode 302 of the organic EL device 300 electrically come into contact with each other.

The OELD 300 will now be described in more detail. The transparent conductive material 309 formed of ITO which is about 1000 Å in thickness is formed on the first substrate 311 by evaporation or sputtering. The transparent conductive material 309 is constructed such that light generated in the light-emitting layer 305 is transmitted toward the front of the OELD 300. Transparent conductive materials other than ITO, such as IZO, may also be used.

Since ITO generally has a high work function in comparison to the light-emitting layer 305, materials other than the ITO are used as a portion of the cathode 310 that is directly in contact with organic EL layer. In one example, a thin metal film 308 of at most about a few tens of angstroms (Å), such as aluminum, magnesium, calcium or the like which has a low work function is further formed on the transparent conductive material 309 to thereby construct the cathode 310. The work function of the metal film 308 is lower than that of the transparent conductive material and may be lower than that of the material forming the anode.

Since metal is generally opaque, in one embodiment the metal film is thin enough to permit a substantial amount of light incident thereon to be transmitted therethrough, such as greater than about 90% to substantially all of the incident light, or, for example, greater than about 90%, greater than about 95%, or greater than about 99%. In various non-exclusive embodiments, aluminum or one or more other metals such as platinum are used as the metal film 308. This metal film 308 has a thickness of about 10-50 Å or about 10 Å. The metal film 308 is used in the cathode 310 because electron injection can be actively performed by lowering an energy barrier formed between the cathode 310 and the organic EL structure 312. Accordingly, luminous efficiency can be increased.

If calcium (Ca) or magnesium (Mg) is used as the cathode, the luminous efficiency can be increased in comparison to using aluminum. However, calcium readily oxidizes in air. Moreover, calcium diffuses easily into light-emitting layer, thereby doping the light-emitting layer and causing a leakage current to flow. Aluminum, on the other hand, does not oxidize in air as readily as calcium.

Other conductive materials that do not oxidize in air as readily as aluminum may be used to form the anode. Examples of these materials may include metals such as gold, platinum or chromium. Similarly, the anode may be formed from one or more of the above materials. Accordingly, in some embodiments, either or both the anode or cathode can comprise a multilayer structure. As shown in FIG. 4B, for example, the anode 302 contains a first layer 302a and a second layer 302b. The first layer 302a contacts the hole injection layer 303. The second layer 302b contacts the drain electrode 330 and comprises a metal film having a work function larger than that of the first layer 302a. As shown, the second layer 302b is an outermost layer of the multilayer anode 302. Although only two layers are shown in FIG. 4B, in embodiments in which the anode contains more than two layers, the outermost layer may comprise a metal film having a work function larger than that of at least one of the other layers of the multilayer structure.

Figure 4C:
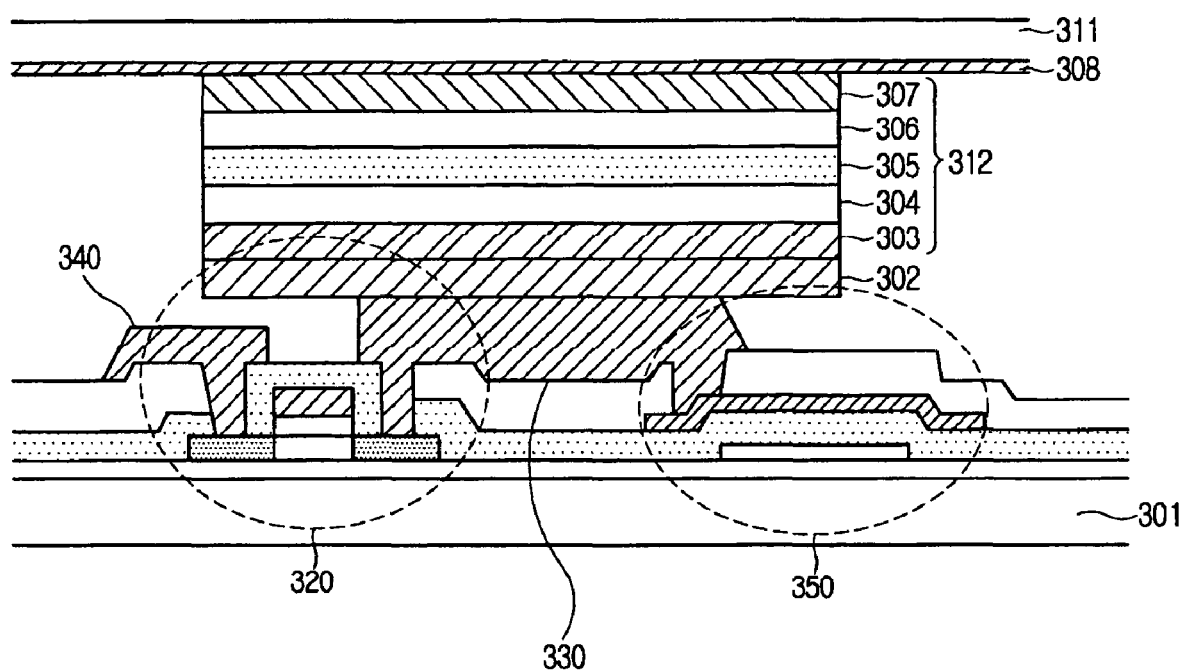

In another embodiment, shown in FIG. 4C, the cathode is formed from the thin conductive metal film 308 provided directly on the substrate 311 without a transparent conductive material therebetween. As shown in this figure, unlike the arrangements of FIG. 4A or 4B, the step is not formed. If desired, a step can be formed by processing the substrate 311 or forming a metal layer and processing the metal layer to become the thin conductive metal film 308. Removal of the transparent conductive material decreases the thickness of the organic EL device 300.

In addition, although not shown, a circular polarizer is present on the outer side of the substrate through which the light from the light-emitting layer is emitted in some embodiments. However, the circular polarizer reduces the amount of light emitted from the device by up to about 40%. Thus, in other embodiments, if the circular polarizer is removed, the thickness of the metal film can be increased without substantially affecting the amount of light emitted from the device. In these embodiments, the metal film may have a thickness of about 10-300 Å. Metal films having a thickness of about 100-300 Å may be semi-transparent.

As mentioned above, an exciton is formed in the light-emitting layer 305. An exciton is a combination of an electron and a hole that are bound to each other in a manner similar to a hydrogen atom. Accordingly, the exciton, similar to the hydrogen atom, has excited states. When the exciton is in an excited state and falls into a ground state (or the electron and hole recombine), light is emitted. A high polymer organic EL such as Alq3 and Anthracene, PPV (poly(p-phenylenevinylene)), PT (polythiophene) or the like, or derivatives thereof can be used to form the light-emitting layer 305.

An oxadiazole derivative can be used as the electron transfer layer 306 formed between the light-emitting layer 305 and the cathode 310. The electron transfer layer 306 helps introduce electrons smoothly into the light-emitting layer 305 by lowering the value of the work function between the cathode 310 and the light-emitting layer 305. Like the electron transfer layer 306, the electron injection layer 307 serves to reduce the work function between the cathode 310 and the light-emitting layer 305. Therefore, in some cases, only the electron transfer layer 307 may be formed between the cathode 310 and the light-emitting layer 305.

Meanwhile, the hole transfer layer 304 is formed between the light-emitting layer 305 and the anode 302. TPD, which is a diamine derivative, and poly(9-vinylcarazole), which is a photoconductive polymer, can be used as the hole transfer layer 304. The hole transfer layer 304 lowers the work function between the anode 302 and the light-emitting layer 305 to thereby introduce holes smoothly into the light-emitting layer 305.

By a combination of such transfer layers, quantum efficiencies are increased, and a driving voltage can be reduced through a two-step injection process in which carriers are not directly injected into the light-emitting layer but pass through the transfer layers.

The anode 302 formed at the outside of the hole injection layer 303 supplies the holes to the light-emitting layer 305 and simultaneously serves as a reflector for reflecting light generated from the light-emitting layer 305 toward the front of the organic EL device 300. Therefore, a conductive material having excellent reflection characteristics can be used as the anode 302. In one embodiment, an opaque conductive anode having the excellent reflection characteristics can be formed using an aluminum layer or a platinum layer having a thickness of thousands of angstroms (Å) on the hole injection layer 303.

As described, the present invention can prevent the cathode 310 from being exposed to moisture in air by preventing an air gap between the substrate 311 and the cathode 310 by forming a transparent conductive material 309 constructing part of the cathode 310 directly on the substrate 311. In addition, by forming the cathode 310 closer to the substrate than the anode 302, the cathode 310 and anode 302 can be formed from one or more layers in which the electron affinity, and thus oxidation potential, is smaller.

In embodiments in which bottom emission is desired, the anode 302 may transparent or semi-transparent, as above, while the cathode 310 may be opaque.

In the organic EL display device 300 shown, the organic EL device 300 is formed on upper cover glass 311 and the array substrate 301 on which a thin film transistor 320 is formed. In addition, an anode 302 of the organic EL device 300 and the drain electrode 330 of the driving thin film transistor 320 electrically contact each other. Accordingly, in order to easily contact the drain electrode 330 and the driving thin film transistor 320 and the anode 302 with each other, the organic EL device 300 is formed to have a step. That is, the portion of the anode 302 in contact with the drain electrode 330 of the driving thin film transistor 320 is protruded to easily contact the drain electrode 330. Protrusion of the organic EL device 300 can be made by patterning the substrate 311, patterning one of the organic layers, or patterning the transparent conductive layer 309.

Hereinafter, with reference to FIGS. 5A to 5D, a procedure for fabricating an organic EL display device of the present invention will be described.

Figure 5A:
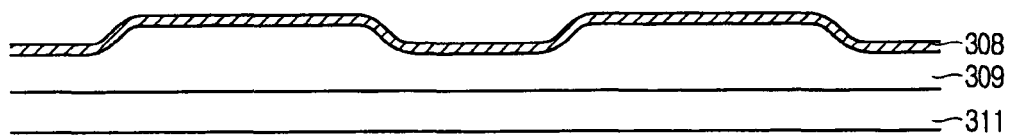
FIGS. 5A to 5D are views sequentially illustrating a procedure for fabricating the organic electroluminescence device of the present invention.

An organic EL display device 300 is fabricated by forming an organic EL layer structure 312 on a first substrate 311 and then attaching an array substrate 301 formed by a separate process from the first substrate 311. Therefore, as illustrated in FIG. 5A, the first substrate 311 formed of transparent glass or plastic is provided. A transparent electrode layer 309 formed of ITO is formed on the first substrate 311 by evaporation or sputtering. Then, the transparent conductive layer 309 is formed to have a step through photolithography. The step is formed at each unit pixel.

A thin conductive metal film 308 such as aluminum is formed on the transparent conductive material layer 309. The thin conductive metal film 308 can be formed by sputtering or some other deposition method. The thin conductive metal film 308 is in the range of about a few tens of angstroms (Å), thin enough such that light can be transmitted therethrough.

The transparent electrode 309 and the thin conductive metal film 308 together form a cathode 310 of the organic EL device 300.

Figure 5B:
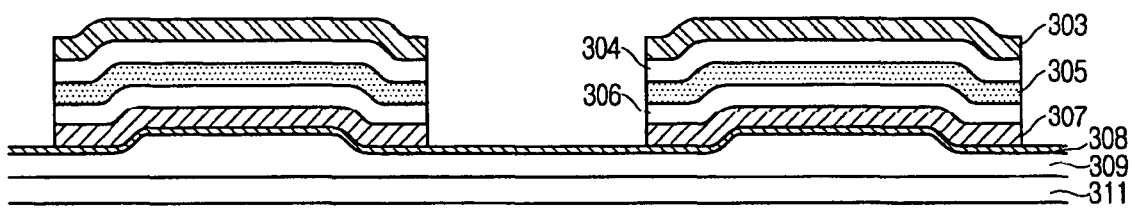

After the cathode 310 is formed, as illustrated in FIG. 5B, the electron injection layer 307 and the electron transfer layer 306 are formed on the cathode 310. The electrode injection layer 307 and the electron transfer layer 306 may be an organic layer. In particular, the electron injection layer 307 may be a LiF layer having a low work function such that the electrons can be smoothly moved to a light-emitting layer 305.

In addition, the oxadiazole derivative can be used as the electron transfer layer 306. By reducing the value of the work function between the cathode 310 and the light-emitting layer 305, the electron transfer layer 306 helps introduce the electrons smoothly into the light-emitting layer 305.

Then, the light-emitting layer 305 is formed on the electron transfer layer 306. The light-emitting layer 305 includes luminescence centers which can be formed of a metal compound. The luminescence centers are capable of generating light of a particular wavelength and thus implements a predetermined color. In particular, light-emitting layers capable of generating red, green and blue lights, respectively, are formed by one group and constitute one pixel, thereby implementing color.

Then, a hole transfer layer 304 and a hole injection layer 303 are sequentially deposited on the light-emitting layer 305. The electron injection layer 307, the electron transfer layer 306, the light-emitting layer 305, the hole transfer layer 304 and the hole injection layer 303 which may be organic films are patterned by photolithography to thereby form the organic layer structure 312.

As described, a double-heterostructure of two or more organic materials having different band gaps is formed between the light-emitting layer 305 and the cathode 310, and between the light-emitting layer 305 and the anode 302. This is because by decreasing Fermi level, the electrons or the holes are smoothly injected to the light-emitting layer 305, a driving voltage can be reduced, and luminous efficiency can be increased. Therefore, in some cases, the double-heterostructure between the light-emitting layer 305 and the anode 302 and between the light-emitting layer 305 and the cathode 310 is not be formed.

TPD, which is a diamine derivative, and poly(9-vinylcarazole), which is a photoconductive separator, can be used as the hole transfer layer 304. In addition, TPD (N-N'-diphenyl-N,N'-bis (3-Methylphenyl)-(1,1'-Biphenyl)-4,4'-diamine) may be also used. The TPD can be formed in a vacuum by evaporation.

Figure 5C:
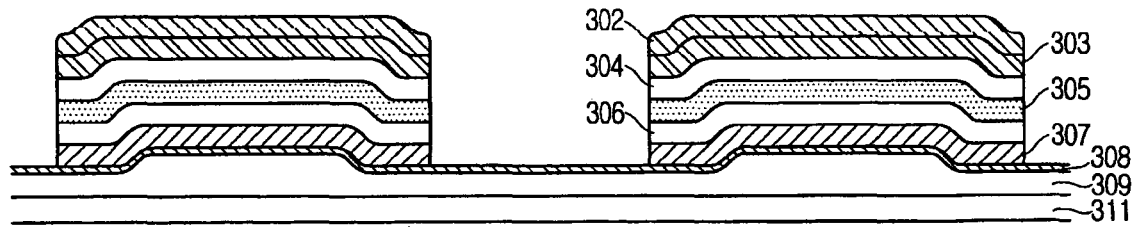

Then, as illustrated in FIG. 5C, a conductive metal film such as aluminum, platinum or the like (or combinations of layers thereof) is formed on the hole injection layer 303 by sputtering, and is patterned to form the anode 302. The anode 302 is formed on the hole injection layer 303 so as to not generate a short with the cathode 310.

The organic EL display device 300 shown in the embodiment is a front light emitting type. An opaque metal film having excellent reflection characteristics can be used as the anode 302 such that light generated from the light-emitting layer 305 is emitted toward the front of the OELD 300. In the present embodiment, an aluminum layer and/or a platinum layer formed in a thickness of tens of angstroms (Å) is used as the anode 302.

As a result of such processes, the cathode 310 is formed on the entire surface of the first substrate 311. The organic light-emitting layer structure 312 are arranged in a matrix format on the first substrate 311. The anodes 302 are formed at the organic light-emitting layer structure 312. The unit pixels are formed in a matrix format on the first substrate 311.

Meanwhile, an array substrate 301 on which a switching device 370 and a driving device 320 are formed at each unit pixel by a semiconductor fabrication procedure is provided. Here, the array substrate 301 is fabricated by a separate procedure from that used to fabricate the layers on the first substrate 311. The array substrate 301 corresponds to the first substrate 311. That is, unit pixels on the array substrate 301 corresponding to the respective organic EL devices 300 of the first substrate 311 are arranged in a matrix form. The processes used to fabricate the switching device 370 and driving device 320 are well known in the art and thus will not be further described here.

Figure 5D:
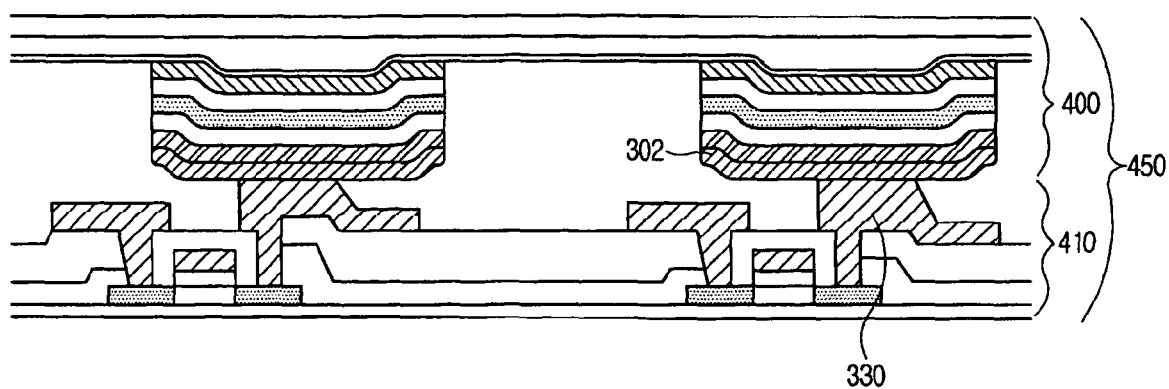

After the array substrate 301 is completed, as illustrated in FIG. 5D, an upper substrate 400 on which the OEL devices 420 are formed and a lower substrate 410 on which the driving thin film transistors 320 are formed are bonded to each other. At this time, the two substrates 301 and 311 are bonded to each other such that the drain electrode 330 of the driving thin film transistor 320 and the anode 302 of the OEL device 420 come in contact with each other, thereby completing an organic EL display device 450. Therefore, damage to a cathode which is caused by the environment, such as moisture, after an organic EL device is fabricated is mitigated by removing a gap between the cathode and a substrate. The gap is removed by forming the cathode on the substrate, forming the organic EL layer on the cathode, and forming the anode on the organic EL layer, rather than forming the anode on the substrate, forming the organic EL layer on the anode, and forming the cathode on the organic EL layer. The cathode may comprise a metal film or a multilayer structure including a metal film and a transparent conductive material. The efficiency of light generated from a light-emitting layer of the organic EL device is increased. The area of an organic EL layer formed at each unit pixel is also increased by forming organic EL devices on cover glass separate from the array substrate and therefore the vividness of the organic EL device is increased.

Furthermore, unlike liquid crystal display devices, the organic EL device has excellent viewing angle characteristics without the use of a separate light source as the organic EL layer itself emits light. In addition, fabrication of organic EL devices is possible at a relatively low temperature compared with liquid crystal display devices.

Although numerous embodiments have been presented individually, these embodiments may be combined in various manners. As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An organic light emitting device comprising:
   a first substrate;
   a cathode on the first substrate, wherein the cathode comprises a transparent conductive material layer on the first substrate and a metal film formed on the transparent conductive material layer, and wherein the metal film transmits light incident from following organic electroluminescence (EL) layer and has a work function smaller than that of the following organic electroluminescence (EL) layer, and the cathode has a step;

an organic electroluminescence (EL) layer on the metal film of the cathode, wherein the organic EL layer comprises an electron injection layer and an electron transfer layer that transmit electrons supplied from the cathode; a hole injection layer and a hole transfer layer that transmit holes supplied from an anode; and an organic light-emitting layer between the electron transfer layer and the hole transfer layer;

the anode on the organic EL layer, the cathode disposed closer to the first substrate than the anode;

a second substrate corresponding to the first substrate; and a driving transistor containing a drain electrode on the second substrate, wherein the drain electrode comes in contact with the anode to bond the first substrate and the second substrate to each other.

2. The device of claim 1, wherein the metal film has a thickness of less than about 50 angstroms.

3. The device of claim 2, wherein the metal film has a thickness of about 10 angstroms.

4. The device of claim 1, wherein the metal film has a thickness of about 100 angstroms to about 300 angstroms.

5. The device of claim 4, wherein the metal film directly contacts the first substrate.

6. The device of claim 1, wherein the anode comprises a metal film having a work function larger than that of the cathode.

7. The device of claim 1, wherein the anode comprises a multilayer structure.

8. The device of claim 7, wherein an outermost layer of the multilayer structure comprises a metal film having a work function larger than that of at least one of the other layers of the multilayer metal structure.

9. The device of claim 1, wherein the anode comprises an opaque thin film.

10. The device of claim 1, wherein the anode has a protrusion that contacts the drain electrode of the driving transistor.

11. The device of claim 10, wherein the protrusion in the anode is formed by the step on the cathode.

12. An organic light emitting device comprising:
a first substrate;
a cathode on the first substrate, wherein the cathode comprises a transparent conductive material layer on the first substrate and a metal film formed on the transparent conductive material layer, and wherein the metal film transmits light incident from following organic electroluminescence (EL) layer and has a work function smaller than that of the following organic electroluminescence (EL) layer, and the cathode has a step;
an organic electroluminescence (EL) layer on the metal film of the cathode, wherein the organic EL layer comprises an electron injection layer and an electron transfer layer that transmit electrons supplied from the cathode; a hole injection layer and a hole transfer layer that transmit holes supplied from an anode; and an organic light-emitting layer between the electron transfer layer and the hole transfer layer;
the anode on the organic EL layer, the cathode disposed closer to the first substrate than the anode, wherein the anode has a protrusion formed by the step on the cathode;
a second substrate corresponding to the first substrate; and
a driving transistor containing a drain electrode on the second substrate, wherein the drain electrode comes in contact with the anode
to bond the first substrate and the second substrate to each other.

13. The device of claim 12, wherein the metal film has a thickness of less than about 50 angstroms.

14. The device of claim 13, wherein the metal film has a thickness of about 10 angstroms.

15. The device of claim 12, wherein the metal film has a thickness of about 100 angstroms to about 300 angstroms.

16. The device of claim 12, wherein the metal film directly contacts the first substrate.

17. The device of claim 12, wherein the anode comprises a metal film having a work function larger than that of the cathode.

18. The device of claim 12, wherein the anode comprises a multilayer structure.

19. The device of claim 18, wherein an outermost layer of the multilayer structure comprises a metal film having a work function larger than that of at least one of the other layers of the multilayer metal structure.

20. The device of claim 12, wherein the anode comprises an opaque thin film.

21. An organic light emitting device comprising:
a first substrate;
a cathode on the first substrate, wherein the cathode comprises a transparent conductive material layer on the first substrate and a metal film formed on the transparent conductive material layer, and wherein the metal film transmits light incident from following organic electroluminescence (EL) layer and has a work function smaller than that of the following organic electroluminescence (EL) layer, and the metal film is formed in the range of about 10 to 50 angstroms to transmit light, the cathode has a step;
an organic electroluminescence (EL) layer on the metal film of the cathode, wherein the organic EL layer comprises an electron injection layer and an electron transfer layer that transmit electrons supplied from the cathode; a hole injection layer and a hole transfer layer that transmit holes supplied from an anode; and an organic light-emitting layer between the electron transfer layer and the hole transfer layer;
the anode on the organic EL layer, the cathode disposed closer to the first substrate than the anode, wherein the anode has a protrusion formed by the step on the cathode;
a second substrate corresponding to the first substrate; and
a driving transistor containing a drain electrode on the second substrate, wherein the drain electrode comes in contact with the anode
to bond the first substrate and the second substrate to each other.

* * * * *